United States Patent [19]
Robinson

[11] Patent Number: 6,098,639
[45] Date of Patent: *Aug. 8, 2000

[54] WET CLEANS FOR COMPOSITE SURFACES

[75] Inventor: Karl M. Robinson, Boise, Id.

[73] Assignee: Micron Technology, Inc., Boise, Id.

[*] Notice: This patent is subject to a terminal disclaimer.

[21] Appl. No.: 09/373,175

[22] Filed: Aug. 12, 1999

Related U.S. Application Data

[63] Continuation of application No. 08/653,670, May 24, 1996, Pat. No. 5,944,906.

[51] Int. Cl.⁷ .................................. B08B 3/12; B08B 7/04
[52] U.S. Cl. .................................................. 134/1.3; 134/3
[58] Field of Search .................................. 134/1.2, 1.3, 2, 134/3, 28, 29, 34, 41

[56] References Cited

U.S. PATENT DOCUMENTS

| | | | |
|---|---|---|---|
| 3,597,667 | 8/1971 | Horn | 148/DIG. 43 |
| 4,817,652 | 4/1989 | Liu et al. | 422/113 |
| 5,259,888 | 11/1993 | McCoy | 134/2 |
| 5,944,906 | 8/1999 | Robinson | 134/1.3 |

Primary Examiner—Ivars Cintins
Attorney, Agent, or Firm—Workman, Nydegger & Seeley

[57] ABSTRACT

A composite surface at which at least two materials having different isoelectric points are exposed is cleaned by an HF dip, followed immediately by a dip in a low pH surfactant, followed by an optional rinse in deionized water, followed by a dip in ammonium hydroxide, followed immediately by a dip in a high pH surfactant, and followed by a rinse in deionized water. By maintaining the relatively extreme pH levels of the immediately preceding steps, the surfactant dips significantly prevent the formation of a charge differential between the different portions of the composite surface, which charge differential would otherwise tend to cause any particles present to remain on one portion of the composite surface or the other. The surfactant properties of surfactant dips help remove any particles from the composite surface, resulting in substantial removal of particles from the composite surface.

43 Claims, 2 Drawing Sheets

WET CLEANS FOR COMPOSITE SURFACES

RELATED APPLICATIONS

This is a continuation application of U.S. patent application Ser. No. 08/653,670, filed on May 24, 1996, now U.S. Pat. No. 5,944,906, titled Wet Cleans for Composite Surface, which is incorporated herein by reference.

BACKGROUND OF THE INVENTION

1. The Field of the Invention

The present invention relates to the manufacture of semiconductor devices. More particularly, the present invention is directed to methods for performing a wet clean of a composite surface, i.e., a surface having at least two materials exposed, where the composite surface is situated on a semiconductor wafer. The methods are particularly useful during the manufacture of a semiconductor device for a post chemical mechanical polishing clean of a surface having an exposed interface of silica and nitride, silica and low κ dielectric, or nitride and low κ dielectric, where κ (lower kappa) is intended to represent the dielectric constant.

2. The Relevant Technology

Wet clean processes used in semiconductor manufacturing are typically applied to surfaces of uniform composition. While the contamination to be removed may of course have a different composition, the surface to be cleaned is itself generally of uniform composition, i.e., all silica, all silicon, all silicon nitride, etc. In certain instances, however, it has become desirable to perform wet cleaning on a composite surface, a surface having at least two different materials exposed, such as at least two of silica, silicon, nitride, low κ dielectric, and other materials used in the formation of semiconductor devices. For example, where chemical mechanical polishing is used to planarize a layer of silica stopping on nitride, both silica and nitride are exposed on the resulting planarized surface. Such composite surfaces are not well cleaned by standard wet cleans. Particulate contamination is especially difficult to remove from composite surfaces with standard wet cleans. Thus, an improved method for wet cleaning composite surfaces is needed.

SUMMARY AND OBJECTS OF THE INVENTION

An object of the present invention is to provide a method for wet cleaning a composite surface.

Another object of the present invention is to provide a method for performing a post chemical mechanical polishing clean of a composite surface.

Yet another object of the present invention is to provide a method for performing a post chemical mechanical polishing wet clean of a composite surface including silica and silicon nitride.

Still a further object of the present invention is to provide a method for performing a wet clean of a composite surface including at least two exposed materials with differing isoelectric points.

Still a further object of the present invention is to provide a method for performing a wet clean of a composite surface, which method substantially reduces particulate contamination.

In accordance with the present invention, a composite surface is cleaned by an HF dip or scrub, followed immediately by a rinse or dip in a low pH surfactant. The dip may also be aided by ultrasonic waves. Preferred low pH surfactants include organic carboxylic acids, currently most preferably citric acid, but additionally pentadecanoic acid or other similar long chain acids. The low pH of the low pH surfactant significantly prevents the formation of a charge differential between portions of the composite surface having different materials exposed, which charge differential would otherwise potentially cause any particles present to remain on one or another portion of the composite surface. The surfactant properties of the selected low pH surfactant help to remove any particles from the surface.

Next follows a dip or scrub in ammonium hydroxide, followed immediately by a dip or scrub in a high pH surfactant. The dip may also be aided by ultrasonic waves. Preferred high pH surfactants include any compounds having a structure including a hydrophobic organic structure with at least one ammonium hydroxide group, currently most preferably tetramethylammoniumhydroxide (TMAH). Following the rinse in the high pH surfactant is a rinse in deionized water. The high pH of the high pH surfactant significantly prevents the formation of a charge differential between portions of the composite surface having different materials exposed, which charge differential would otherwise potentially cause any particles still present to remain on one or another portion of the composite surface. The surfactant properties of the selected high pH surfactant help to remove any particles from the surface. The deionized water rinse then removes the high pH surfactant from the surface, leaving a very clean, low particulate surface on all portions of the composite surface.

These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and objects of the invention are obtained may be more fully explained, a more particular description of the invention briefly described above will be rendered by reference to specific embodiments and applications thereof which are illustrated in the appended drawings. Understanding that these drawings depict only typical embodiments and applications of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

As an overview, the present invention provides a method for wet cleaning of composite surfaces, i.e., surfaces having more than one material exposed, such as silica and nitride, silica and low κ dielectric, nitride and low κ dielectric, etc. The method is especially effective at removing particulate contamination, such as, for example, silica particles remaining on a surface after chemical mechanical polishing. Such particulate contamination is not well removed from composite surfaces by standard wet cleans.

Figure 1:
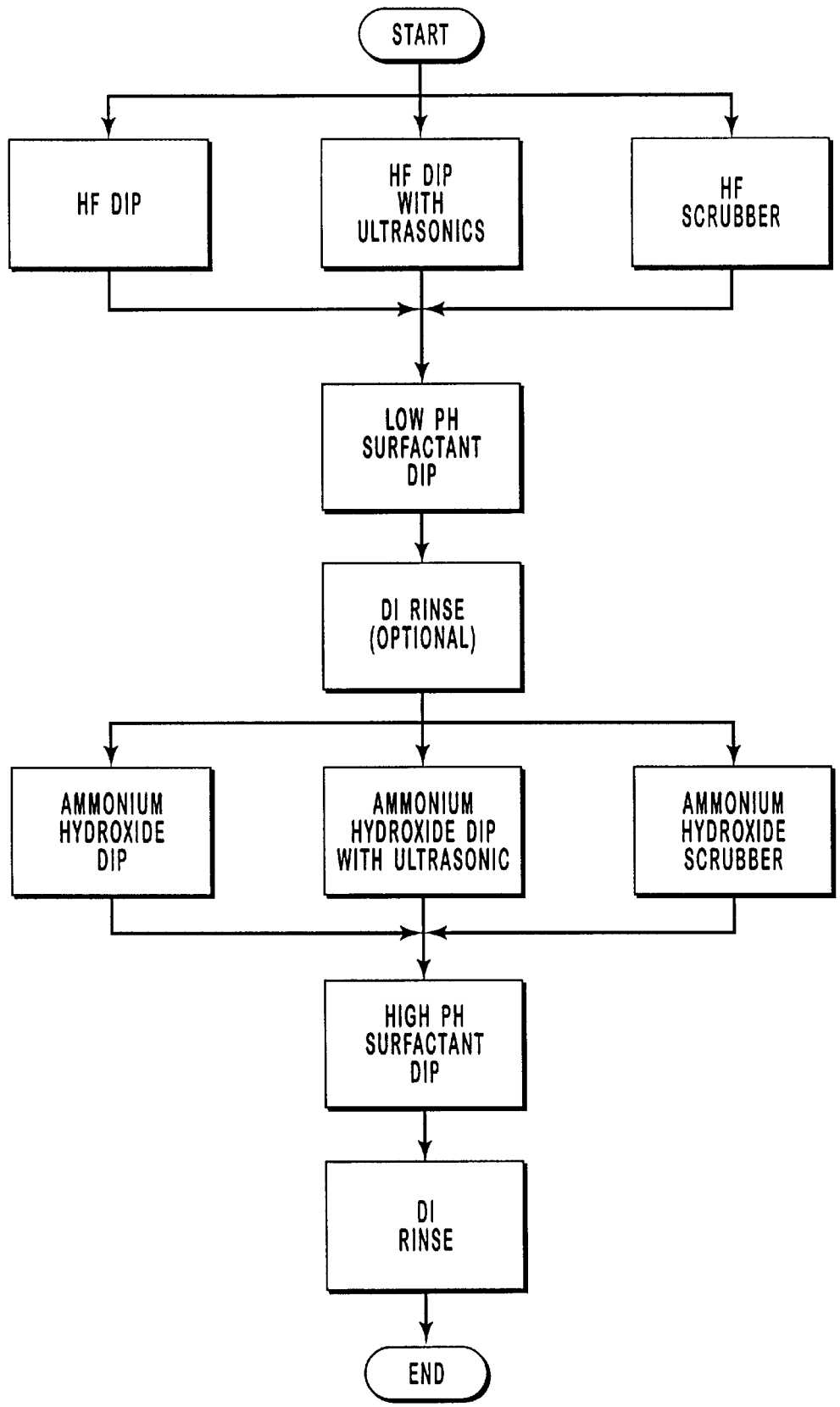
FIG. 1 is a flow diagram of methods of the present invention.

According to the present invention, a composite surface is cleaned by performing the process illustrated in the flow diagram of FIG. 1. In a presently preferred application of the process, the composite surface is typically a surface of a semiconductor wafer which has been chemically mechanically polished, leaving silica particle contamination.

As a first step, the composite surface is contacted with hydrofluoric acid (HF). This is preferably achieved by dipping the wafer in hydrofluoric acid, where the dip may also be assisting in its cleaning function by the generation of ultrasonic waves within the dip. By way of example of an ultrasonic dip, a hood at a wet station for the HF dip may be equipped with conventional ultrasonic wave generation capabilities. As such, particles on the wafer are more easily removed due to the assistance of the ultrasonic waves within the dip.

Figure 2:
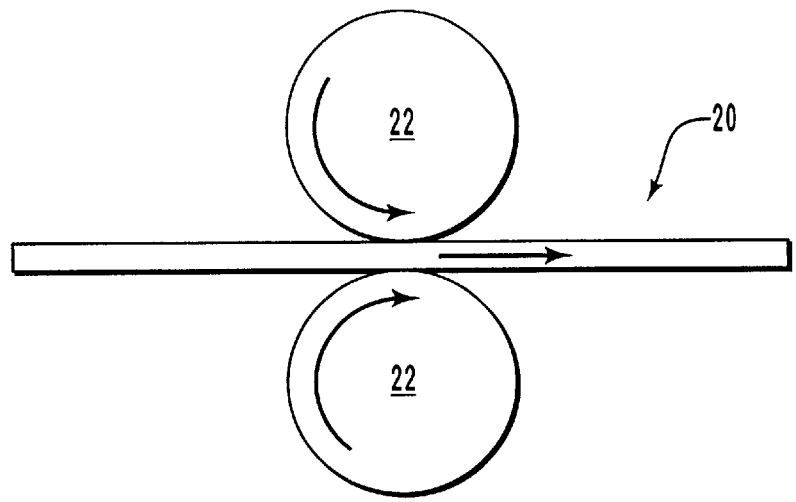
FIG. 2 is a schematic representation of a semiconductor wafer scrubber.

The forgoing dipping the wafer in hydrofluoric acid may be replaced with a scrubbing step, an example of which is seen in FIG. 2. A wafer 20 is rotated within a nip and in a plane perpendicular to a plane in which two scrubbing brushes 22,22 forming the nip therebetween rotate while an HF solution is contacted with wafer 20. Scrubbing brushes 22, 22 of a conventional scrubber are preferred and are typically composed of polyvinyl alcohol.

Next, the composite surface is contacted with a low pH surfactant, preferably an organic carboxylic acid surfactant, most preferably citric acid. The organic carboxylic acid surfactant can also be pentadecanoic acid or other similar long chain acids. The contact with the composite surface is preferably achieved by dipping the wafer in citric acid or flowing citric acid, rinsing the wafer in citric acid, spraying the composite surface of the wafer with citric acid, or a similar technique. Then the composite surface is optionally rinsed with deionized water. This may be achieved in any of many ways known to those of skill in the art, including but not limited to dip tanks and scrubbers.

Next the composite surface is contacted with ammonium hydroxide. This is preferably achieved by dipping the wafer in an ammonium hydroxide solution, and this may be done in an ultrasonic scrubbing tank in which ultrasonic waves are generated in the ammonium hydroxide solution to assist in particle removal. Next, the composite surface is contacted with a high pH surfactant, preferably a surfactant having a chemical structure including an organic hydrophobic structure together with at least one ammonium hydroxide group, and most preferably tetramethylammoniumhydroxide. The contact with the composite surface is preferably achieved by dipping the wafer in tetramethylammoniumhydroxide, and this may likewise be done in an ultrasonic scrubbing tank in which ultrasonic waves are generated in the ammonium hydroxide solution to assist in particle removal. Then the composite surface is again rinsed with deionized water.

The forgoing step of dipping the wafer in ammonium hydroxide may be replaced with a scrubbing step while contacting the wafer with the ammonium hydroxide solution. An example of such a scrubbing step is seen in FIG. 2 and is conducted as described above with respect to the HF scrubbing step.

The first step of the process flow shown in FIG. 1, the HF dip, is preferably performed in hydrofluoric acid having preferably a concentration within the range of about 4:1 to about 250:1, and most preferably a concentration of about 100:1. Other known ways of contacting the composite surface with HF may optionally be substituted for the HF dip.

The second step of the process flow shown in FIG. 1, the low pH surfactant dip, should be performed soon, and preferably immediately, after the HF dip, and without any intervening rinse in deionized water. If a deionized water rinse were to follow the HF dip, particles would collect on one or another portion of the composite surface. This is a result of a buildup of a charge differential between different portions of the composite surface. With a nitride and silica composite surface, for example, at higher pH values (such as a pH of about 7 as for deionized water) silica becomes strongly negatively charged, while nitride is neutral or only slightly negative. Particles such as silica particles are also negatively charged, preventing the particles from being removed by translational motion along the composite surface, and resulting in a concentration of particles on nitride portions of the composite surface.

The second step of the process flow shown in FIG. 1, the low pH surfactant dip, is preferably performed in a surfactant with a pH value within the range of about 1 to about 4, more preferably a range of about 2 to about 4, and most preferably about pH 2.2. At these pH levels, no significant charge is built up on silica particles and silica portions of the composite surface. The immediate transfer of the composite surface from contact with HF to contact with the low pH surfactant, without an intervening deionized water rinse, keeps the pH low and prevents particles and potions of the composite surface from becoming charged. The surfactant properties of the low pH surfactant assist in washing away particles, allowing the composite surface to be cleansed of particles.

In the third and optional step of the process flow shown in FIG. 1, the deionized water (DI) rinse, deionized water is used to gradually increase the pH after the low pH surfactant rinse. The low pH surfactant is gradually removed from the composite surface, and the pH level at the composite surface increases gradually, eventually passing a point at which portions of the composite surface become charged. By that point, however, any particles have been substantially removed from the composite surface, either by the low pH surfactant dip or by the initial stages of the deionized water rinse. The novel method can be performed with or without the forgoing DI rinse, and also contemplates performing with a fast and non-gradual DI rinse.

The fourth step of the process flow shown in FIG. 1, the ammonium hydroxide dip, is preferably performed in an ammonium hydroxide solution having a concentration within the range of about 1:1 to about 10:1, and most preferably a concentration of about 3:1. Other known ways of contacting the composite surface with ammonium hydroxide may optionally be substituted for the ammonium hydroxide dip.

The fifth step of the process flow shown in FIG. 1, the high pH surfactant dip, should be performed soon, and preferably immediately, after the ammonium hydroxide dip, and without any intervening rinse in deionized water. The high pH surfactant dip is preferably performed in a surfactant with a pH value within the range of about 8 to about 10, and most preferably about pH 9.5. At these pH levels, all portions of the composite surface tend to become negatively charged, and a buildup of charge differential between different portions of the composite surface is substantially prevented. The immediate transfer of the composite surface from contact with ammonium hydroxide to contact with the high pH surfactant, without an intervening deionized water rinse, keeps the pH high and prevents a charge differential from arising. The surfactant properties of the high pH surfactant assist in washing away particles.

In the sixth step of the process flow shown in FIG. 1, the deionized water rinse, the high pH surfactant is gradually removed from the composite surface, and the pH level at the composite surface decreases gradually, eventually passing a point at which a charge differential will arise. By that point, however, any remaining contaminant particles have been substantially removed from the composite surface, either by the high pH surfactant dip or by the initial stages of the deionized water rinse.

Figure 3:
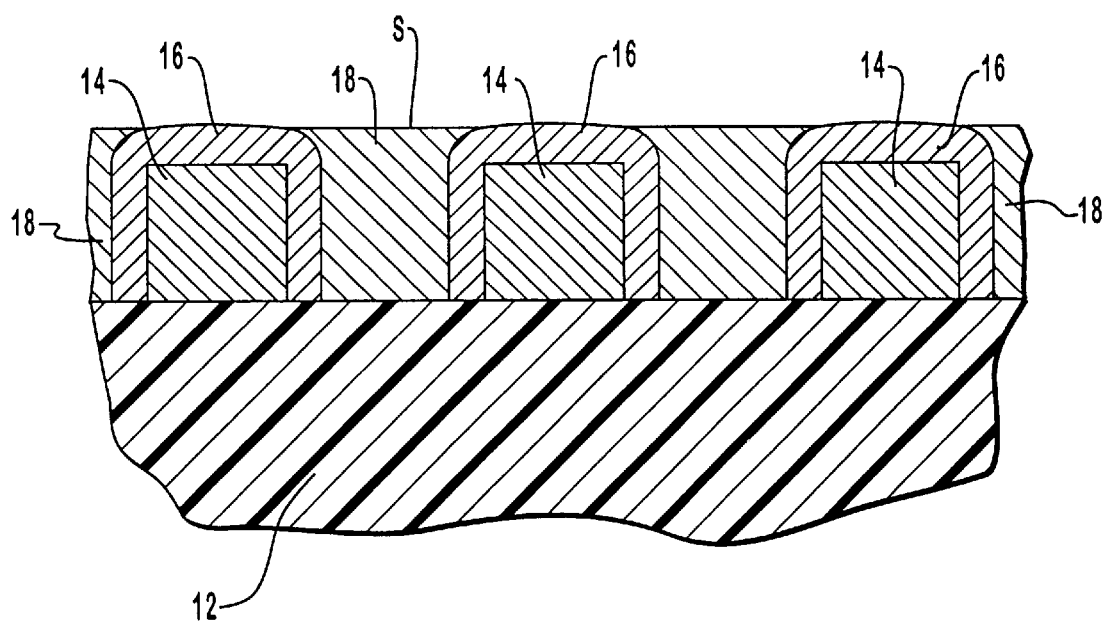
FIG. 3 is a partial cross section of a partially formed semiconductor device on which a method of the present invention may be beneficially performed.

A presently preferred application for the method shown in FIG. 1 is illustrated in FIG. 3. FIG. 3 is a partial cross section of a partially formed semiconductor device showing a substrate 12 upon which gate stacks 14 have been formed, each enclosed by a layer 16 of a first dielectric material. A layer 18 of a second dielectric material was then deposited over gate stacks 14 and layers 16, then etched back or chemically mechanically polished back to the point of exposing layers 16, resulting in a composite surface S, at which both the first dielectric material of layer 16 and the first dielectric material of layer 18 are exposed.

One presently preferred material for the first dielectric material of layer 16 is nitride, with a silica such as BPSG for the first dielectric material of layer 18. The relatively more durable nitride can then be used to provide a stop for chemical mechanical polishing. The first dielectric material of layer 18 may also be a dielectric material to reduce the capacitance between adjacent gate stacks. The first dielectric material of layer 16 may also be silica of some kind.

Regardless which of the above materials are exposed in combination at surface S, the method of the present invention may be beneficially employed to clean surface S. The method of the present invention may further be beneficially applied in virtually any process requiring a clean of a composite surface having two or more exposed materials with different isoelectric points, i.e. different charging behavior as a function of pH.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method for cleaning a first surface composed of a dielectric material having a dielectric constant and second surface composed of a dielectric material having a dielectric constant that is lower than the dielectric constant of the first surface, the method comprising:
   sequentially exposing the first and second surfaces:
      to a hydrofluoric acid solution;
      then to a first surfactant having a pH from about 1 to about 4;
      then to an ammonium hydroxide solution;
      then to a second surfactant having a pH from about 8 to about 10; and
      then to deionized water;
   wherein there are ultrasonic waves propagating in at least one of:
      the hydrofluoric acid solution;
      the first surfactant;
      the ammonium hydroxide solution; and
      the second surfactant.

2. The method as defined in claim 1, further comprising, prior to said sequentially exposing, chemical mechanical planarizing to expose the first and second surfaces.

3. The method as defined in claim 1, wherein the hydrofluoric acid solution has a pH from about 1 to about 4.

4. The method as defined in claim 1, further comprising scrubbing the first and second surfaces with a scrub brush during said exposing the first and second surfaces to said hydrofluoric acid solution.

5. The method as defined in claim 1, wherein said hydrofluoric acid solution has a water to hydrofluoric acid concentration ratio within the range of about 4:1 to about 250:1.

6. The method as defined in claim 1, wherein said first surfactant comprises an organic carboxylic acid surfactant.

7. The method as defined in claim 6, wherein said organic carboxylic acid surfactant is citric acid.

8. The method as defined in claim 1, wherein said ammonium hydroxide solution has a water to ammonium hydroxide concentration ratio within the range of about 1:1 to about 10:1.

9. The method as defined in claim 1, wherein said second surfactant comprises a surfactant having a structure including an organic hydrophobic structure together with at least one ammonium hydroxide group.

10. The method as defined in claim 9, wherein said second surfactant is tetramethylammoniumhydroxide.

11. A method for cleaning an oxide surface having a dielectric constant and another surface composed of a material having a dielectric constant lower than the dielectric constant of the oxide surface, the method comprising:
   sequentially exposing said oxide surface and said another surface:
      to a hydrofluoric acid solution;
      then to a first surfactant having a pH from about 1 to about 4;
      then to an ammonium hydroxide solution;
      then to a second surfactant having a pH from about 8 to about 10; and
      then to deionized water;
   wherein there are ultrasonic waves propagating iii at least one of:
      the hydrofluoric acid solution;
      the first surfactant;
      the ammonium hydroxide solution; and
      the second surfactant.

12. The method as defined in claim 11, further comprising, prior to said sequentially exposing, chemical mechanical planarizing to expose said oxide surface and said another surface.

13. The method as defined in claim 11, wherein the hydrofluoric acid solution has a pH from about 1 to about 4.

14. The method as defined in claim 11, further comprising scrubbing said oxide surface and said another surface with a scrub brush during said exposing said oxide surface and said another surface to said hydrofluoric acid solution.

15. The method as defined in claim 11, wherein said hydrofluoric acid solution has a water to hydrofluoric acid concentration ratio within the range of about 4:1 to about 250:1.

16. The method as defined in claim 11, wherein said first surfactant comprises an organic carboxylic acid surfactant.

17. The method as defined in claim 16, wherein said organic carboxylic acid surfactant is citric acid.

18. The method as defined in claim 11, wherein said ammonium hydroxide solution has a water to ammonium hydroxide concentration ratio within the range of about 1:1 to about 10:1.

19. The method as defined in claim 11, wherein said second surfactant comprises a surfactant having a structure including an organic hydrophobic structure together with at least one ammonium hydroxide group.

20. The method as defined in claim 19, wherein said second surfactant is tetramethylammoniumhydroxide.

21. A method for cleaning a nitride surface having a dielectric constant and another surface composed of a material having a dielectric constant lower than the dielectric constant of the nitride surface, the method comprising:

sequentially exposing said nitride surface and said another surface:
   to a hydrofluoric acid solution;
   then to a first surfactant having a pH from about 1 to about 4;
   then to an ammonium hydroxide solution;
   then to a second surfactant having a pH from about 8 to about 10; and
   then to deionized water;
wherein there are ultrasonic waves propagating in at least one of:
   the hydrofluoric acid solution;
   the first surfactant;
   the ammonium hydroxide solution; and
   the second surfactant.

22. The method as defined in claim 21, further comprising, prior to said sequentially exposing, chemical mechanical planarizing to expose said nitride surface and said another surface.

23. The method as defined in claim 21, wherein the hydrofluoric acid solution has a pH from about 1 to about 4.

24. The method as defined in claim 21, further comprising scrubbing said nitride surface and said another surface with a scrub brush during said exposing said nitride surface and said another surface to said hydrofluoric acid solution.

25. The method as defined in claim 21, wherein said hydrofluoric acid solution has a water to hydrofluoric acid concentration ratio within the range of about 4:1 to about 250:1.

26. The method as defined in claim 21, wherein said first surfactant comprises an organic carboxylic acid surfactant.

27. The method as defined in claim 26, wherein said organic carboxylic acid surfactant is citric acid.

28. The method as defined in claim 21, wherein said ammonium hydroxide solution has a water to ammonium hydroxide concentration ratio within the range of about 1:1 to about 10:1.

29. The method as defined in claim 21, wherein said second surfactant comprises a surfactant having a structure including an organic hydrophobic structure together with at least one ammonium hydroxide group.

30. The method as defined in claim 29, wherein said second surfactant is tetramethylammoniumhydroxide.

31. A method for cleaning an oxide surface and a nitride surface, the method comprising;

sequentially exposing the oxide and nitride surfaces:
   to a hydrofluoric acid solution;
   then to a first surfactant having a pH from about 1 to about 4;
   then to an ammonium hydroxide solution;
   then to a second surfactant having a pH from about 8 to about 10; and
   then to deionized water;
wherein there are ultrasonic waves propagating in at least one of:
   the hydrofluoric acid solution;
   the first surfactant;
   the ammonium hydroxide solution; and
   the second surfactant.

32. The method as defined in claim 31, further comprising, prior to said sequentially exposing, chemical mechanical planarizing to expose the oxide and nitride surfaces.

33. The method as defined in claim 31, wherein the hydrofluoric acid solution has a pH from about 1 to about 4.

34. The method as defined in claim 31, further comprising scrubbing the oxide and nitride surfaces with a scrub brush during said exposing the oxide and nitride surfaces to said hydrofluoric acid solution.

35. The method as defined in claim 31, wherein said hydrofluoric acid solution has a water to hydrofluoric acid concentration ratio within the range of about 4:1 to about 250:1.

36. The method as defined in claim 31, wherein said first surfactant comprises an organic carboxylic acid surfactant.

37. The method as defined in claim 36, wherein said organic carboxylic acid surfactant is citric acid.

38. The method as defined in claim 31, wherein said ammonium hydroxide solution has a water to ammonium hydroxide concentration ratio within the range of about 1:1 to about 10:1.

39. The method as defined in claim 31, wherein said second surfactant comprises a surfactant having a structure including an organic hydrophobic structure together with at least one ammonium hydroxide group.

40. The method as defined in claim 39, wherein said second surfactant is tetramethylammoniumhydroxide.

41. A cleaning method comprising:

chemical mechanical planarizing a structure to expose thereon an oxide surface and a nitride surface;
sequentially exposing the oxide and nitride surfaces:
   to a hydrofluoric acid solution;
   then to citric acid having a pH from about 1 to about 4;
   then to an ammonium hydroxide solution;
   then to tetramethylammoniumhydroxide having a pH from about 8 to about 10; and
   then to deionized water;
wherein there are ultrasonic waves propagating in at least one of:
   the hydrofluoric acid solution;
   the citric acid;
   the ammonium hydroxide solution; and
   the tetramethylammoniumhydroxide.

42. The method as defined in claim 41, further comprising scrubbing the oxide and nitride surfaces with a scrub brush during said exposing the oxide and nitride surfaces to said hydrofluoric acid solution.

43. The method as defined in claim 41, wherein the hydrofluoric acid solution has a pH from about 1 to about 4.

* * * * *

UNITED STATES PATENT AND TRADEMARK OFFICE
CERTIFICATE OF CORRECTION

PATENT NO.    : 6,098,639
DATED         : August 8, 2000
INVENTOR(S)   : Karl M. Robinson It is certified that error appears in the above-identified patent and that said Letters Patent is hereby corrected as shown below:

<u>Column 4,</u>
Line 24, after "particles and" change "potions" to -- portions --

<u>Column 6,</u>
Line 38, after "propagating" change "iii" to -- in --

Signed and Sealed this

Nineteenth Day of March, 2002

Attest:

JAMES E. ROGAN
*Director of the United States Patent and Trademark Office*

*Attesting Officer*